(12) United States Patent
Kiryu et al.

(10) Patent No.: US 9,470,501 B2
(45) Date of Patent: Oct. 18, 2016

(54) CONTACT-TERMINAL APPARATUS WITH PRESSURE SENSOR

(75) Inventors: Koichi Kiryu, Nagano (JP); SeungSeok Beak, Tokyo (JP); Kimiyo Takahashi, Tokyo (JP); Mitsuru Kobayashi, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 544 days.

(21) Appl. No.: 13/455,273

(22) Filed: Apr. 25, 2012

(65) Prior Publication Data

US 2013/0110459 A1  May 2, 2013

(30) Foreign Application Priority Data

Apr. 28, 2011 (JP) ................ 2011-102164

(51) Int. Cl.
*G01B 5/26* (2006.01)
*G06F 3/041* (2006.01)
*H03K 17/96* (2006.01)
*G06K 9/00* (2006.01)
*G01R 1/04* (2006.01)
*H01R 13/24* (2006.01)

(52) U.S. Cl.
CPC .............. *G01B 5/26* (2013.01); *G01R 1/0416* (2013.01); *G06F 3/0414* (2013.01); *G06K 9/00* (2013.01); *H03K 17/964* (2013.01); *H01R 13/24* (2013.01)

(58) Field of Classification Search
CPC ..... G06F 3/0414; H03K 17/964; G06K 9/00
USPC ......................................... 702/156; 324/136
See application file for complete search history.

(56) References Cited

U.S. PATENT DOCUMENTS

| 5,828,773 | A * | 10/1998 | Setlak | G06K 9/0002 382/126 |
|---|---|---|---|---|
| 6,522,773 | B1 * | 2/2003 | Houdeau | 382/124 |
| 6,989,677 | B2 * | 1/2006 | Morimoto | 324/660 |
| 7,555,150 | B2 * | 6/2009 | Ikeda | 382/124 |
| 8,378,508 | B2 * | 2/2013 | Bond et al. | 257/787 |
| 2002/0005569 | A1 | 1/2002 | Kobayashi et al. | |
| 2008/0202824 | A1 * | 8/2008 | Philipp et al. | 178/18.01 |
| 2009/0002199 | A1 * | 1/2009 | Lainonen et al. | 341/20 |

(Continued)

FOREIGN PATENT DOCUMENTS

| CN | 101008606 | 8/2007 |
|---|---|---|
| EP | 0568342 | 11/1993 |

(Continued)

OTHER PUBLICATIONS

JP2000074966 A (Machine Translation of IDS submitted reference).*

(Continued)

*Primary Examiner* — Paul D Lee
*Assistant Examiner* — Mark Crohn
(74) *Attorney, Agent, or Firm* — IPUSA, PLLC

(57) ABSTRACT

A contact-terminal apparatus for use in measuring an electrical property of an object includes a first contact-terminal unit made of a conductive material to come in contact with the object, a movable part having a first surface on which the first contact-terminal unit is placed, and a pressure sensor situated beneath a second surface of the movable part, wherein the pressure sensor has a pressure detecting part that is in contact with the second surface of the movable part.

6 Claims, 6 Drawing Sheets

(56) References Cited

U.S. PATENT DOCUMENTS

2011/0032077 A1* 2/2011 Setlak ............... G06K 9/0002
340/5.83
2011/0193813 A1* 8/2011 Gralewski et al. ........... 345/173

FOREIGN PATENT DOCUMENTS

| JP | S62-027957 | 2/1987 |
|----|------------|--------|
| JP | S63-238853 | 10/1988 |
| JP | H01-005530 | 1/1989 |
| JP | H02-295544 | 12/1990 |
| JP | H07-307657 | 11/1995 |
| JP | H11-164196 | 6/1999 |
| JP | 2000-74966 | 3/2000 |
| JP | 2002-025729 | 1/2002 |

OTHER PUBLICATIONS

CN 101008606 A (Machine Translation of IDS submitted reference).*
Partial Translation of JP 2000-74966 (Yoshida).*
Machine Translation of JP 2000-74966 (Yoshida).*
Chinese Patent Publication No. CN101008606A, published Aug. 1, 2007 Application No. 200710026570.8, filed Jan. 26, 2007; Inventors: Huang, Ping, Ding, Lingyun,; Assignee: South China University of Technology (Full English Translation).*
Japanese Patent Publication No. JP2000074966, published Mar. 14, 2000, Application No. 10247536, filed Sep. 1, 1998; Inventor Yoshida, Yoshihiko et al (Full English Translation).*
Ritter, Arthur B., Biomedical Engineering Principles (CRC Press 2011)[Excerpts].*

* cited by examiner

CONTACT-TERMINAL APPARATUS WITH PRESSURE SENSOR

BACKGROUND OF THE INVENTION

1. Field of the Invention

The disclosures herein relate to a contact-terminal apparatus.

2. Description of the Related Art

Contact terminals or connectors are used in order to establish electrical connection and perform electrical measurement. Contact points to be electrically connected to each other may both be made of a highly conductive material. In such a case, a connector can be used without paying much attention to the area size through which electrical connection is established.

An object to come in contact with a contact terminal or the like may have low conductivity at a contact point. In such a case, electrical properties may change depending on the area size of the contact point that comes in contact with the contact terminal. In order to measure electrical properties, a contact terminal may be designed in such a fashion as to provide a constant contact area size.

This type of contact terminal works properly when an object to come in contact with the contact terminal is made of hard material. When the object is soft, however, the contact area size between the object and the contact terminal may change depending on a force imposed on the object. This makes it difficult to perform accurate electrical measurement with respect to the object.

Accordingly, it may be preferable to provide a contact-terminal apparatus that allows accurate electrical measurement to be performed with respect to an object that is made of a soft material having a relatively high resistance value.

[Patent Document 1] Japanese Patent Application Publication No. 2002-25729

SUMMARY OF THE INVENTION

It is a general object of the present invention to provide a contact-terminal apparatus that substantially obviates one or more problems caused by the limitations and disadvantages of the related art.

According to an embodiment, a contact-terminal apparatus for use in measuring an electrical property of an object includes a first contact-terminal unit made of a conductive material to come in contact with the object, a movable part having a first surface on which the first contact-terminal unit is placed, and a pressure sensor situated beneath a second surface of the movable part, wherein the pressure sensor has a pressure detecting part that is in contact with the second surface of the movable part.

According to at least one embodiment, a contact-terminal apparatus is provided that allows accurate electrical measurement to be performed with respect to an object that is made of a soft material having a relatively high resistance value.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments will be described by referring to the accompanying drawings. The same elements throughout the drawings are referred to by the same numerals, and a description thereof will be omitted.

[Contact-Terminal Apparatus]

Figure 1A:
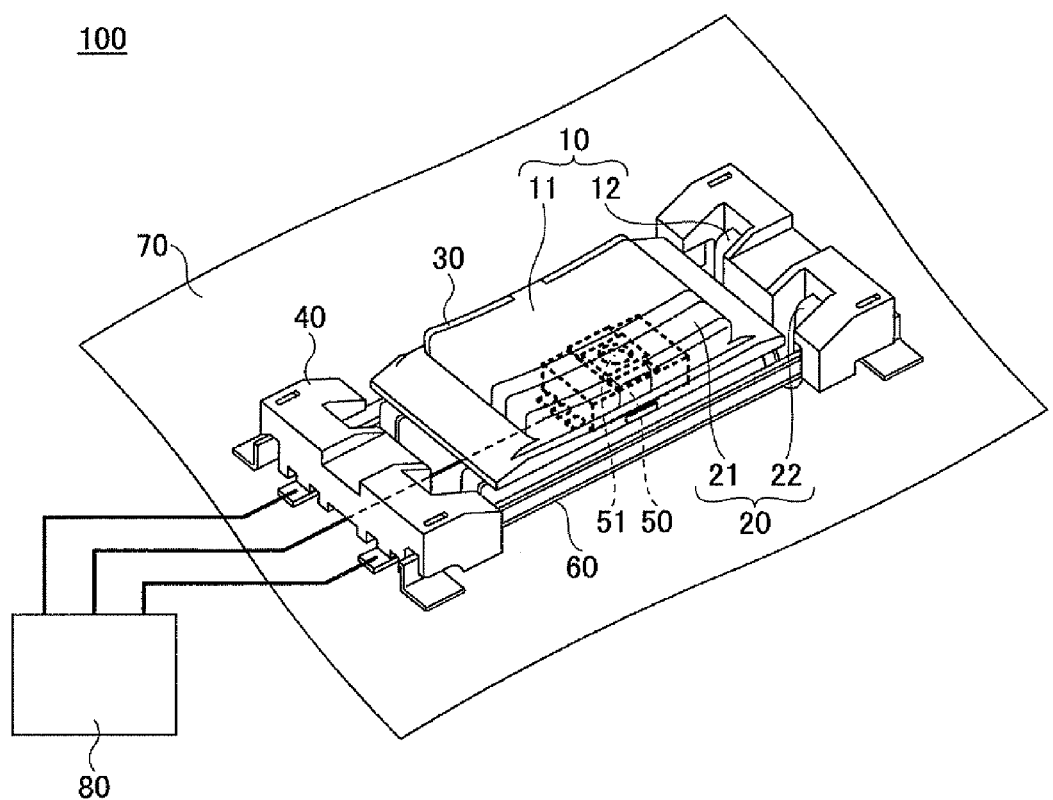
FIGS. 1A and 1B are drawings illustrating the structure of a contact-terminal apparatus of an embodiment.
Figure 1B:
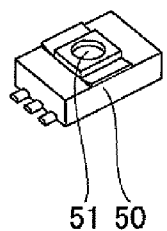

In the following, a contact-terminal apparatus according to an embodiment will be described. A contact-terminal apparatus 100 of the present embodiment serves to measure electrical properties of an object upon being brought in contact with the object. The contact-terminal apparatus 100 includes a first contact-terminal unit 10, a second contact-terminal unit 20, a movable part 30, fixed parts 40, a pressure sensor 50, and a frame 60. The contact-terminal apparatus 100 is attached to a substrate 70. FIG. 1A is an oblique perspective view of the contact-terminal apparatus of the present embodiment. FIG. 1B is an oblique perspective view of the pressure sensor 50 situated under the movable part 30. The contact-terminal apparatus 100 of the present embodiment is typically used with an object that is made of a soft material having a relatively low resistance value. Such an object may be a finger, a human skin, or the like.

The first contact-terminal unit 10 is made of a conductive material such as copper alloy or the like exhibiting electrical conductivity. The first contact-terminal unit 10 includes an electrode portion 11 coming in contact with an object and connection portions 12 extending from both sides of the electrode portion 11. The connection portions 12 serve as electric leads and also as springs.

Like the first contact-terminal unit 10, the second contact-terminal unit 20 is made of a conductive material such as copper alloy or the like exhibiting electrical conductivity. The second contact-terminal unit 20 includes an electrode portion 21 coming in contact with an object and connection portions 22 extending from both sides of the electrode portion 21. The connection portions 22 serve as electric leads and also as springs.

The movable part 30 is made of an insulating material such as resin, and has a first surface and a second surface. The first surface of the movable part 30 has a shape, such as a curved shape, conforming to the intended object. The second surface of the movable part 30 is fixedly attached to the electrode portion 11 of the first contact-terminal unit 10 and the electrode portion of the second contact-terminal unit 20. The movable part 30 is placed such as to be movable substantially in a direction perpendicular to the first surface owing to the workings of the connection portions 12 of the first contact-terminal unit 10 and the connection portions 22 of the second contact-terminal unit 20.

The fixed parts 40 are made of an insulating material such as resin. The fixed parts 40 serve to fixedly hold the ends of the connection portions 12 extending on both sides of the first contact-terminal unit 10 and the ends of the connection portions 22 extending on both sides of the second contact-terminal unit 20. Two fixed parts 40 are provided for this purpose. The contact-terminal apparatus 100 of the present embodiment is mounted on the substrate 70 via these fixed parts 40.

The pressure sensor 50 is situated on the second surface side of the movable part 30. The pressure sensor 50 is mounted on the substrate 70. The pressure sensor 50 has a pressure detecting part for detecting pressure. The pressure detecting part 51 is situated at a position at which the second surface of the movable part 30 comes in contact with the tip of the pressure detecting part 51.

The frame 60 is provided for the purpose of securing together the two fixed parts 40. Two frames 60 are connected to opposite ends of each fixed part 40, so that the two fixed parts 40 are securely connected to each other.

In the connection-terminal apparatus of the present embodiment, the movable part 30 is pressed down upon being brought in contact with an object, thereby moving downward so that the second surface of the movable part 30 presses the pressure detecting part 51. The pressure sensor 50 detects pressure that is applied to the pressure detecting part 51 through the above-noted pressing movement.

The contact-terminal apparatus 100 of the present embodiment may further include a control unit 80, which is coupled to the connection portion 12 of the first contact-terminal unit 10, the connection portion 22 of the second contact-terminal unit 20, and the pressure sensor 50.

When an object that is made of a soft material comes in contact with the contact-terminal apparatus 100 of the present embodiment, the area size of a contact point between the object and the electrode portion 11 and the area size of a contact point between the object and the electrode portion 21 may change depending on the force applied to the object. Because of these changes in the area sizes, accurate measurement cannot be performed when measuring electrical properties of the object such as the impedance of the object.

The impedance components such as resistance and capacitance of the object are dependent on the contact area sizes between the object and the electrodes. In order to measure the impedance of the object, the area size of the contact point between the object and the electrode portion 11 of the first contact-terminal unit 10 and the area size of the contact point between the object and the electrode portion 21 of the second contact-terminal unit 20 may preferably be known. When the object is soft, however, the shape of the object may be changed by the force applied to the object, resulting in changes in the area size of the contact point between the object and the electrode portion 11 and the area size of the contact point between the object and the electrode portion 21. Because of this, the resistance and capacitance of the object may also be changed together with the change in the object shape.

In the contact-terminal apparatus 100 of the present embodiment, the pressure sensor 50 detects the pressure applied to the movable part 30 upon an object coming in contact with the movable part 30. Based on the detected pressure value, the control unit 80 calculates the contact area size between the object and the electrode portion 11 and the contact area size between the object and the electrode portion 21. With this accurate information about the contact area sizes between the object and the electrodes, accurate electrical measurement can be performed.

The relationship between the contact area size between the object and the electrode portion 11 and the pressure detected by the pressure sensor 50 differs depending on the shape and physical property of the object, and so does the relationship between the contact area size between the object and the electrode portion 21 and the pressure detected by the pressure sensor 50. The correlation between contact area size between an object and the electrode portion 11 and pressure detected by the pressure sensor 50 as well as the correlation between contact area size between an object and the electrode portion 21 and pressure detected by the pressure sensor 50 may be measured in advance. These measured correlations may be stored in a memory inside the control unit 80. At the time of measurement, the control unit 80 calculates contact area sizes by referring to the stored correlations in response to the pressure detected by the pressure sensor 50.

The control unit 80 may include a current detecting device for detecting an electric current flowing through an object through the first contact-terminal unit 10 and the second contact-terminal unit 20. The control unit 80 may apply voltage between the first contact-terminal unit 10 and the second contact-terminal unit 20. Such applied voltage may be either a direct-current voltage or an alternating-current voltage. Based on the applied voltage and the detected current, the control unit 80 may detect electrical properties such as resistance, capacitance, and impedance of the object placed between the first contact-terminal unit 10 and the second contact-terminal unit 20. A mechanism employed by the control unit 80 for detecting electrical properties is not limited to a particular example. For example, the control unit 80 may include a voltage detecting device for detecting a change in voltage appearing between the first contact-terminal unit 10 and the second contact-terminal unit 20 to determine the capacitance of the object.

The control unit 80 may take into account the calculated area sizes in order to derive the electrical properties of the object. For example, the electrical properties detected from the applied voltage and the detected current may be calibrated or normalized by use of the calculated area sizes, so that the electrical properties per unit area size may be obtained with respect to the object.

The contact-terminal apparatus 100 of the present embodiment is configured such that the width of the electrode portion 11 of the first contact-terminal unit 10 is different from the width of the electrode portion 21 of the second contact-terminal unit 20. In other words, provision is made such that the contact area size between the object and the electrode portion 11 of the first contact-terminal unit 10 is different from the contact area size between the object and the electrode portion 21 of the second contact-terminal unit 20.

Figure 2:
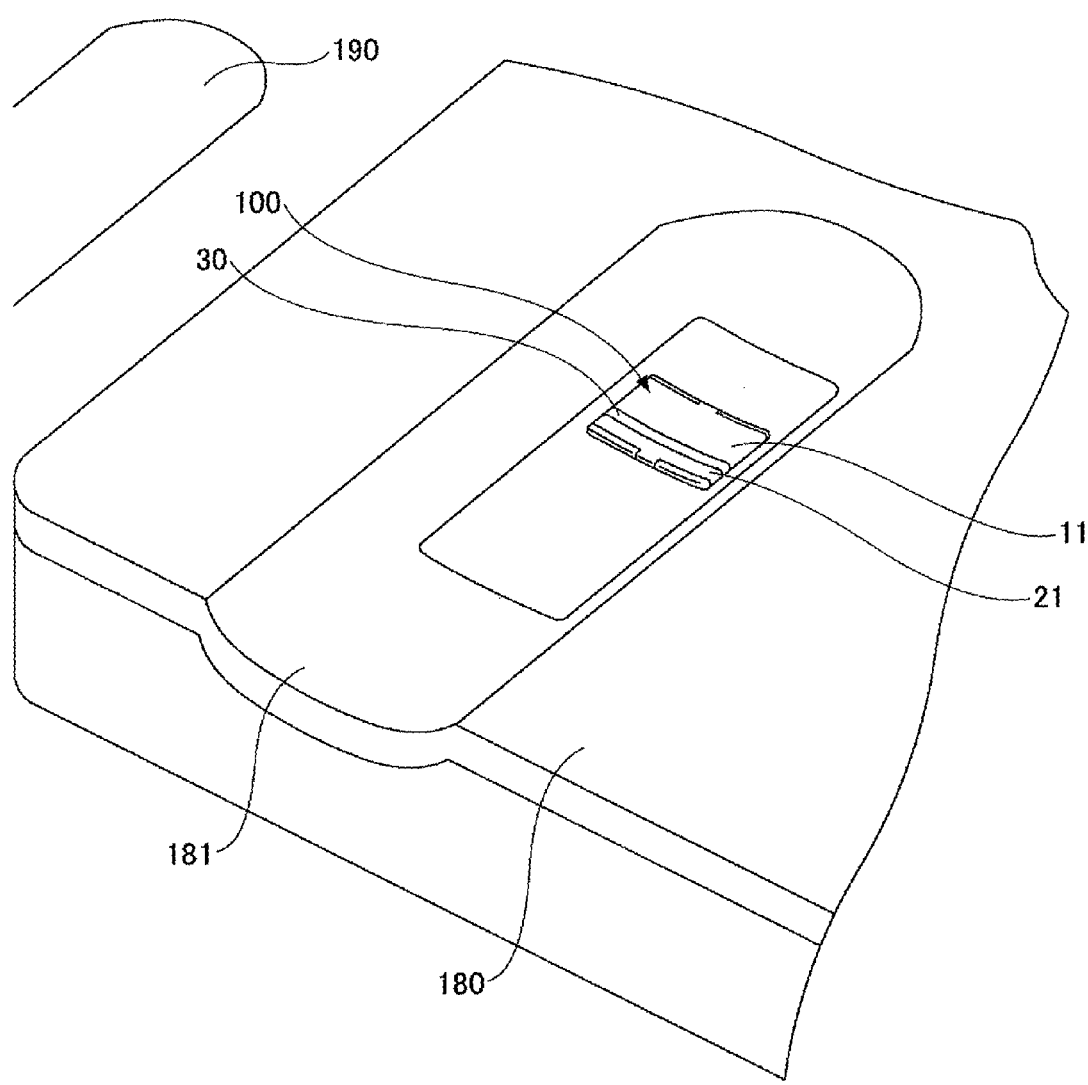
FIG. 2 is an oblique perspective view of the contact-terminal apparatus according to the embodiment.

In the following, a description will be given of the contact-terminal apparatus 100 of the present embodiment mounted to a measurement apparatus or the like by referring to FIG. 2 through FIG. 4. The contact-terminal apparatus 100 of the present embodiment is embedded into a case 180 of a measurement apparatus such that the first surface of the movable part 30 is exposed. Namely, the contact-terminal apparatus 100 of the present embodiment is installed such that the electrode portion 11 of the first contact-terminal unit 10, the electrode portion 21 of the second contact-terminal unit 20, and the movable part 30 are exposed.

The surface of the case 180 has a recess 181 whose shape conforms to the shape of an object 190. In the contact-terminal apparatus 100 of the present embodiment, the surface of the movable part 30 also has a shape that conforms to the shape of the object 190, and is fitted into the recess 181. The substrate 70 on which the contact-terminal apparatus 100 is mounted, the fixed parts 40, and the pressure sensor 50 are embedded inside the case 180 of the measurement apparatus.

The contact-terminal apparatus 100 of the present embodiment allows electrical properties of the object placed between the electrode portion 11 of the first contact-terminal unit 10 and the electrode portion 21 of the second contact-terminal unit 20 to be accurately measured. Such electrical properties may include a resistance value, a capacitance value, an impedance value, and the like. The control unit 80 illustrated in FIG. 1 may detect such electrical properties. The control unit 80 detecting such electrical properties may be part of the contact-terminal apparatus 100. Alternatively, the control unit 80 detecting such electrical properties may be separate from the contact-terminal apparatus 100, and may be part of the measurement apparatus.

Two contact-terminal apparatuses 100 of the present embodiment may be provided. With such provision, electrical properties of an object may be measured between the two electrode portions 11 of the first contact-terminal units 10 of the respective contact-terminal apparatuses 100, between the two electrode portions 21 of the second contact-terminal units 20 of the respective contact-terminal apparatuses 100, and between the electrode portion 11 of the first contact-terminal unit 10 of one contact-terminal apparatus 100 and the electrode portion 21 of the second contact-terminal unit 20 of the other contact-terminal apparatus 100. Such electrical properties may include a resistance value, a capacitance value, an impedance value, and the like.

[Method of Making The Contact-Terminal Apparatus]

In the following, a description will be given of a method of making the contact-terminal apparatus of the present embodiment by referring to FIGS. 5A through 5C and FIGS. 6A through 6C. FIGS. 5A through 5C, FIG. 6A, and FIG. 6C are oblique perspective views taken from above, and FIG. 6B is an oblique perspective view taken from below.

Figure 5A:
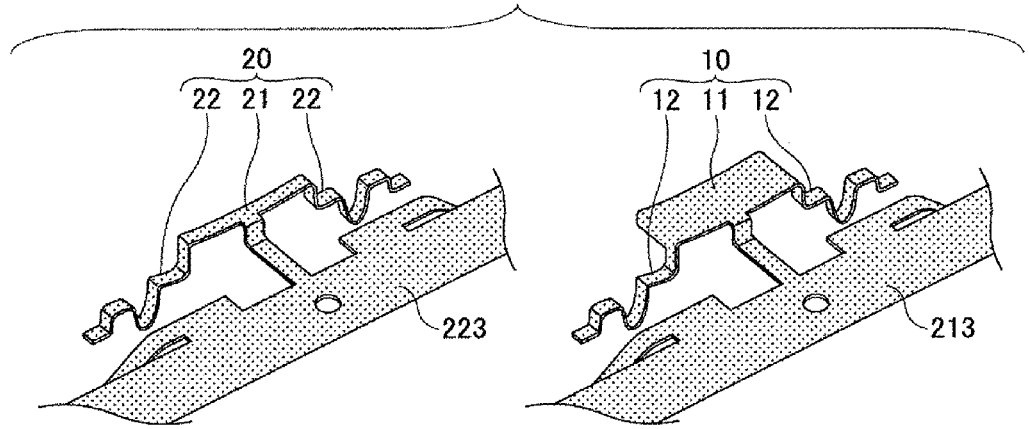
FIGS. 5A through 5C are drawings illustrating a method of making the contact-terminal apparatus according to the embodiment.

As illustrated in FIG. 5A, metal members to become the first contact-terminal unit 10 and the second contact-terminal unit 20 are formed. These metal members may be formed by performing a punching operation to cut a desired shape out of a metal plate, followed by bending the cutout metal parts. The metal member to become the first contact-terminal unit 10 includes the electrode portion 11 and the connection portions 12 to become the respective parts of the first contact-terminal unit 10, and also includes a plate portion 213 for the sake of convenience in manufacturing. The metal member to become the second contact-terminal unit 20 includes the electrode portion 21 and the connection portions 22 to become the respective parts of the second contact-terminal unit 20, and also includes a plate portion 223 for the sake of convenience in manufacturing.

Figure 5B:
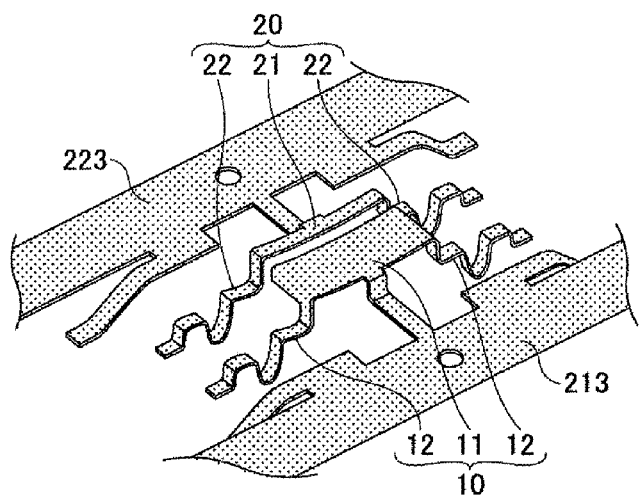

As illustrated in FIG. 5B, the metal member to become the first contact-terminal unit 10 and the metal member to become the second contact-terminal unit 20 are placed in an insert-molding apparatus (not shown) such that the upper surface of the electrode portion 11 of the first contact-terminal unit 10 and the upper surface of the electrode portion 21 of the second contact-terminal unit 20 are flush with each other. Positional adjustment may be performed with respect to the plate portion 213 of the first contact-terminal unit 10 and the plate portion 223 of the second contact-terminal unit 20, respectively, thereby performing the above-noted placement.

Figure 5C:
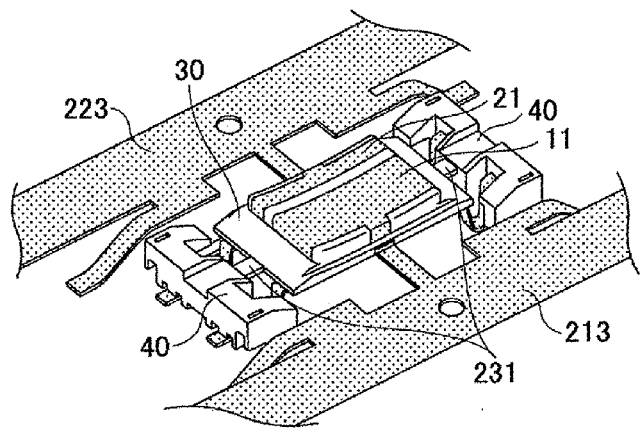

As illustrated in FIG. 5C, insert molding is performed by use of resin to form the movable part 30 and the two fixed parts 40. In this manner, the movable part 30, the electrode portion 11 of the first contact-terminal unit 10, and the electrode portion 21 of the second contact-terminal unit 20 are integrated into a single unit. In this state, the movable part 30 and the fixed parts 40 are connected together through two connecting parts 231.

Figure 6A:
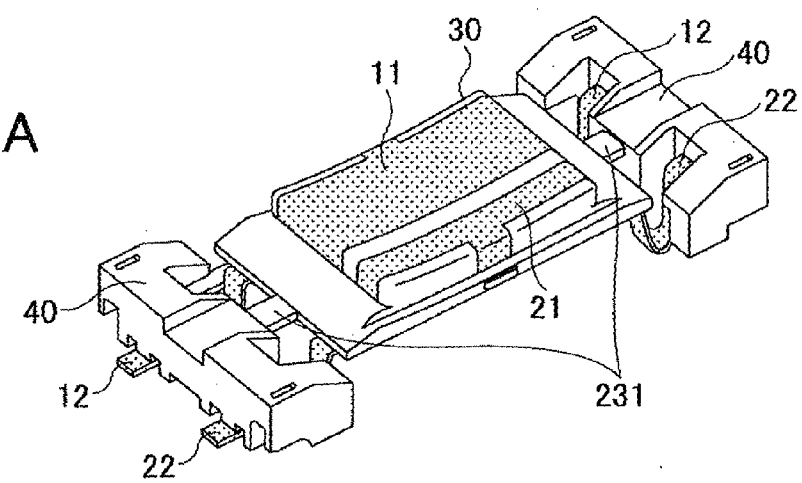
FIGS. 6A through 6C are drawings illustrating the method of making the contact-terminal apparatus according to the embodiment.
Figure 6B:
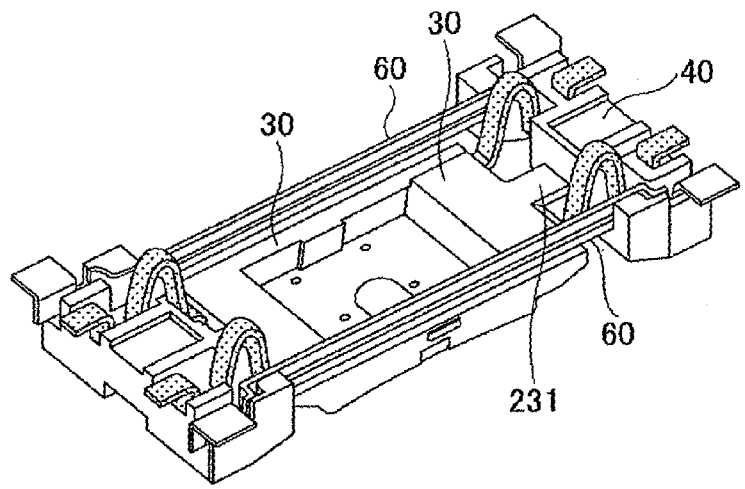

The plate portion 213 of the metal member to become the first contact-terminal unit 10 and the plate portion 223 of the metal member to become the second contact-terminal unit 20 are cut off and removed, resulting in what is illustrated in FIG. 6A. In this manner, the first contact-terminal unit 10 including the electrode portion 11 and the connection portions 12 and the second contact-terminal unit 20 including the electrode portion 21 and the connection portions 22 are formed.

After this, as illustrated in FIG. 6B, the frames 60 are inserted from the back side. Each of the frames 60 has a thin, long strip shape, and has ends thereof that are bent to allow the fixed parts 40 to be fixedly mounted.

Figure 6C:
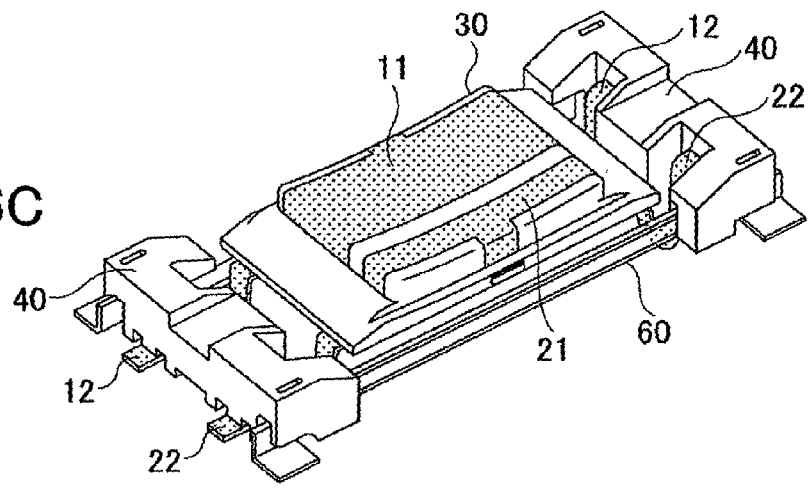

As illustrated in FIG. 6C, the connecting parts 231 for connecting the movable part 30 and the fixed parts 40 together are disconnected. The movable part 30 and the fixed parts 40 are thus separated from each other, so that the movable part 30 is placed in a movable state to be able to move relative to the fixed parts 40.

The process steps described above produce the contact-terminal apparatus 100 of the present embodiment, except for the pressure sensor 50. The movable part 30 is placed such as to be movable substantially in a direction perpendicular to the surface of the movable part 30 since the connection portions 12 of the first contact-terminal unit 10 and the connection portions 22 of the second contact-terminal unit 20 serve as springs.

Figure 3:
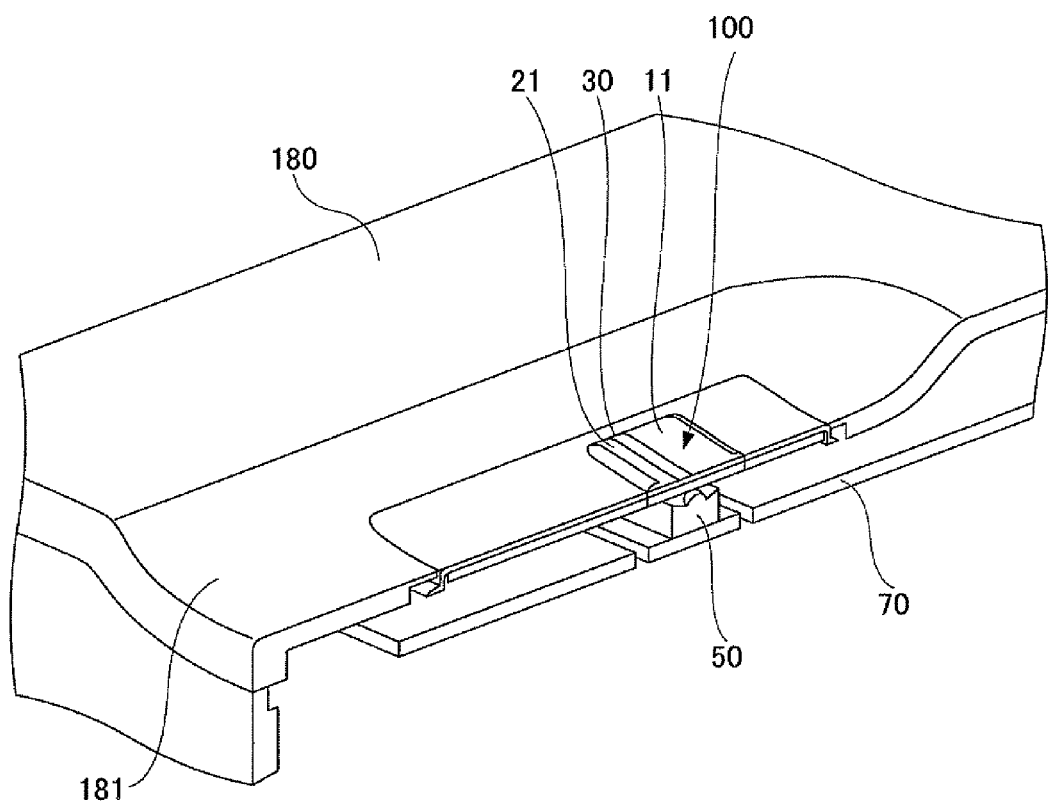
FIG. 3 is a drawing illustrating a cross-sectional view of the contact-terminal apparatus according to the embodiment.
Figure 4:
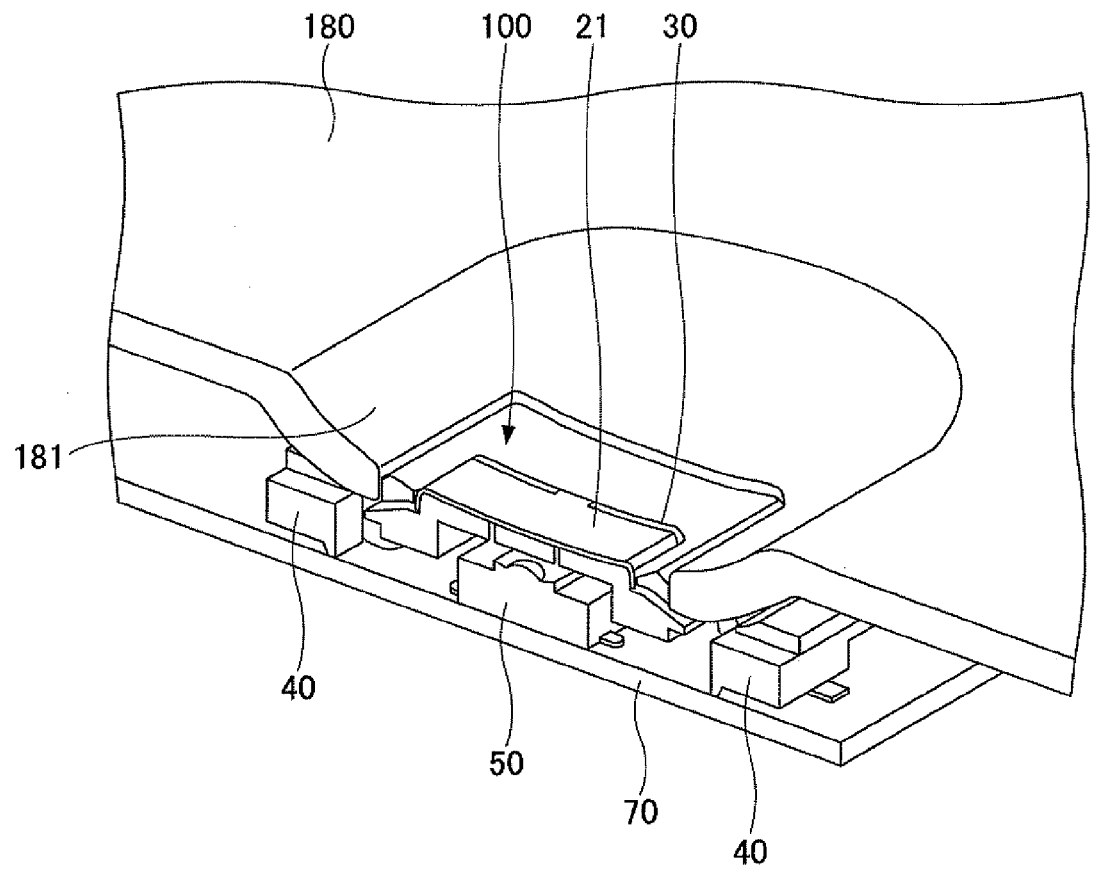
FIG. 4 is a drawing illustrating a cross-sectional view of the contact-terminal apparatus according to the embodiment.

Subsequently, the pressure sensor 50 is placed beneath the back side of the movable part 30 such that the pressure detecting part 51 is in contact with the back surface of the movable part 30 as illustrated in FIG. 1A, FIG. 3, and FIG. 4, thereby producing the contact-terminal apparatus of the present embodiment.

Further, the present invention is not limited to these embodiments, but various variations and modifications may be made without departing from the scope of the present invention.

The present application is based on Japanese priority application No. 2011-102164 filed on Apr. 28, 2011, with the Japanese Patent Office, the entire contents of which are hereby incorporated by reference.

What is claimed is:

1. A contact-terminal apparatus for use in measuring an electrical property of an object, comprising:
   a first contact-terminal unit having a first electrode portion, the first electrode portion being made of a conductive material to come in direct electrical and physical contact with the object;
   a second contact-terminal unit having a second electrode portion, the second electrode portion being made of a conductive material to come in direct electrical and physical contact with the object;
   a movable part having a first surface on which the first contact-terminal unit is placed;
   a pressure sensor situated beneath a second surface of the movable part; and
   a control unit configured to derive, from a value of pressure applied by the object and detected by the pressure sensor, a value of a first area size of contact area between the first electrode portion and the object whose electrical property is being measured and a value of a second area size of contact area between the second electrode portion and the object, the first and second area sizes varying due to deformation of the object in response to the pressure applied by the object to the first and second contact-terminal units, the values of the first and second area sizes being derived from the detected value of the pressure by utilizing a correlation between the pressure and the first and second area sizes, and further configured to measure the electrical property of the object as defined between the first electrode portion and the second electrode portion based on the derived values of the first and second area sizes, the first electrode portion and the second electrode portion having respective sizes different from each other, wherein the pressure sensor has a pressure detecting part that is in contact with the second surface of the movable part.

2. The contact-terminal apparatus as claimed in claim 1, wherein the first contact-terminal unit includes the electrode portion to be in direct electrical contact with the object and connection portions extending on both sides of the electrode portion, and the second contact-terminal unit includes an electrode portion to be in direct electrical contact with the object and connection portions extending on both sides of the electrode portion, wherein the movable part is formed integrally with the electrode portion of the first contact-terminal unit and the electrode portion of the second contact-terminal unit.

3. The contact-terminal apparatus as claimed in claim 2, further comprising:
   a substrate; and
   fixed parts fixedly mounted on the substrate to securely hold ends of the connection portions,
   wherein the pressure sensor is mounted on the substrate, and the connection portions have a spring function, the movable part being movable relative to the fixed parts.

4. The contact-terminal apparatus as claimed in claim 1, wherein the movable part is made of a resin material.

5. The contact-terminal apparatus as claimed in claim 1, wherein the electrical property is one of resistance, capacitance, and impedance.

6. The contact-terminal apparatus as claimed in claim 1, further comprising a memory unit configured to store data indicative of the correlation that is obtained in advance between measured values of the pressure and measured values of the area size.

* * * * *